US005759867A

United States Patent [19]
Armacost et al.

[11] Patent Number: 5,759,867
[45] Date of Patent: Jun. 2, 1998

[54] METHOD OF MAKING A DISPOSABLE CORNER ETCH STOP-SPACER FOR BORDERLESS CONTACTS

[75] Inventors: Michael D. Armacost, Walkill, N.Y.; Jeffrey Peter Gambino, Gaylordsville, Conn.

[73] Assignee: International Business Machines Corporation, Armonk, N.Y.

[21] Appl. No.: 427,296

[22] Filed: Apr. 21, 1995

[51] Int. Cl.$^6$ .................................................. H01L 21/44
[52] U.S. Cl. ..................... 437/195; 437/193; 437/190; 437/203
[58] Field of Search ........................... 437/195, 193, 437/190, 203

[56] References Cited

U.S. PATENT DOCUMENTS

| | | |
|---|---|---|
| 5,466,637 | 11/1995 | Kim .................................. 437/195 |
| 5,482,894 | 1/1996 | Havemann ........................ 437/195 |
| 5,496,771 | 3/1996 | Cronin et al. ..................... 437/195 |
| 5,525,552 | 6/1996 | Huang .............................. 437/195 |
| 5,543,360 | 8/1996 | Matsuoka et al. ................ 437/195 |

*Primary Examiner*—Charles L. Bowers, Jr.
*Assistant Examiner*—Lynne A. Gurley
*Attorney, Agent, or Firm*—Alison D. Mortinger

[57] ABSTRACT

A borderless contact method for a semiconductor device is disclosed employing a disposable etch stopping spacer to protect the upper edges of adjacent structure during contact hole etching. An exemplary FET gate structure is formed on a substrate adjacent to a source or drain diffusion region. A layer of dielectric material is deposited over the structure including the gate stack. An etch stopping spacer, of a material selectively etchable relative to the dielectric material is placed upon the sidewalls and the upper edges of the gate stack.

The resulting structure is blanketed with a glass layer which is selectively masked and etched to provide a hole for making a borderless contact to the substrate adjacent to the gate stack. The spacer itself can be etched away prior to filling the hole with contact material in order to maximize the contact area.

8 Claims, 1 Drawing Sheet

METHOD OF MAKING A DISPOSABLE CORNER ETCH STOP-SPACER FOR BORDERLESS CONTACTS

BACKGROUND OF THE INVENTION

The present invention generally relates to very high packing density microelectronic chip devices and, more particularly, to the use of borderless contacts in such devices.

In the formation of semiconductor devices, it is necessary to provide desired electrical contact between certain devices and to prevent unwanted contact with other devices while doing so in a manner that does not compromise high device packing density on the chip. In order to provide a margin for error in the alignment accuracy of the successive mask levels used in the fabrication of such chips, whereby wanted contact locations are established and unwanted contacts are avoided, border regions had been provided around mask contact locations. Although the border regions proved helpful, they required the allocation and sacrifice of chip surface area which limits the maximum number of integrated circuits that can be packed into a given area.

A number of borderless contact processes have been developed to prevent unwanted and inadvertent contacts without the costly expenditure of chip "real estate" inherent in the allocation of contact border regions. These considerations are well understood in the art and are discussed in more detail, for example, in U.S. Pat. No. 4,966,870, issued Oct. 30, 1990, to Jeffrey R. Barber, et al and assigned to the present assignee.

Borderless contact techniques differ in complexity and efficacy. They generally provide for a desired contact area to overlay a potential undesired contact region, such as, for example, where source and drain contacts of a field effect transistor are allowed to partially overlap the gate region. The various techniques differ from each other in the manner in which electrical isolation nevertheless is maintained between the gate region and the source and drain areas in the case given. One of the problems encountered in the borderless contact example cited is the need to protect against the establishment of unwanted conduction pathways between the gate and the source and drain diffusions of an FET during the etching of the protective insulating areas to provide contact openings. It is important, of course, that such problems be solved with a minimum of complication to pre-existing chip processing and chip structure.

U.S. Pat. No. 5,216,282 issued to Donna R. Cote, et al, on Jun. 1, 1993, and assigned to the present assignee discloses a disposable spacer to be used in the formation of a self-aligned contact hole. The spacer is formed, then removed and replaced with a contact. The spacer is not otherwise used in the contact hole formation process, e.g., it is not also used, as an etch stop.

U.S. Pat. No. 5,264,391, issued to Gov Son et al, on Nov. 23, 1993, teaches the formation of an etch stop layer on top of FET gate layers and across the source region. A central portion of the etch stop layer and the underlying layers are etched away to yield a source contacting region separating adjacent gate regions. Then, insulating spacers are formed on the facing sidewalls of the gates adjacent the source contacting region. It is to be noted that the etch stop and the spacer functions are provided by two distinct structures which require separate processing steps for their formation.

U.S. Pat. No. 4,169,270, issued to James A. Hayes on Sep. 25, 1979, basically discloses two embodiments. In the first embodiment (FIGS. 1 to 12), a spacer is formed after the contact hole is etched in a scheme similar to that of aforementioned U.S. Pat. No. 5,264,391. The second embodiment (FIGS. 13 to 30) involves an $SiO_2$ spacer formed before etching but the spacer is not disposed of after etching the contact hole. If a thick spacer is required to provide a reliable etch stop, then the contact area will be reduced, commensurately.

U.S. Pat. No. 4,686,000 issued to Barbara A. Heath on Aug. 11, 1987, provides a $Si_3N_4$ layer for use as an etch stop on vertical sidewall surfaces to be protected. The etch stop is left in place in the resulting structure.

U.S. Pat. No. 5,166,771 issued to Norman Godinho, et al on Nov. 24, 1992, also teaches the use of an $SiO_2$ layer as an etch stop which is left in place in the structure.

U.S. Pat. No. 5,144,579 issued to Naoko Okabe, et al on Sep. 1, 1992, utilizes a blanket polysilicon etch stop process with a $Si_3N_4$ spacer. The blanket polysilicon after patterning and oxidation, is used as the etch stop, rather than the $Si_3N_4$ spacer. Moreover, the spacer remains in the final structure.

U.S. Pat. No. 5,270,236 issued to Wolfgang Kosner on Dec. 14, 1993, teaches a process which forms a polysilicon plug in the contact area, covers the structure including the plug with a glass and then removes the plug to provide a contact hole. The wall of the contact area is provided with a spacer prior to the formation of the plug from material which is blanket deposited and then removed from all areas other than the contact hole area. The wall of the contact area is formed by portions of a semiconductor device such as the gate of an FET which at least partially comprises the same material type as does the spacer. Extra process steps are required to create and later to remove the plug.

U.S. Pat. No. 4,966,870, issued to Jeffrey R. Barber on Oct. 30, 1990, and assigned to the present assignee, previously cited, provides for borderless contacts but does not employ any spacer (removable or not) at the circumference of the borderless contact to serve as an etch stop.

U.S. Pat. No. 4,182,636 issued to Robert H. Denard, et al on Jan. 8, 1980, and U.S. Pat. No. 4,944,682 issued to John E. Cronin, et al on Jul. 31, 1990, both assigned to the present assignee, like U.S. Pat. No. 4,966,870, teach borderless contacts formed without the use of spacers at the circumferences of the borderless contacts.

U.S. Pat. No. 5,100,838 issued to Charles Dennison on Mar. 31, 1992, discloses a conducting stud or pillar which is covered with dielectric. The pillar is defined by an insulating spacer which is left in place in the structure.

U.S. Pat. No. 5,318,925 issued to Joe K. Kim on Jun. 7, 1994, teaches a self-aligned interlayer contact made with the use of a sidewall spacer but the spacer is formed after contact etch and, thus, is not used as an etch stop in the contact hole formation process.

SUMMARY OF THE INVENTION

One object of the present invention is to provide a method for making a borderless contact for a semiconductor device in which the upper edges of adjacent structure are protected during contact hole etching.

Another object is to provide a method for making a borderless source or drain diffusion contact, in which the upper edges of adjacent gate structure are protected during contact hole etching.

A further object is to provide a method for making a maximized area borderless contact for a semiconductor device in which the upper edges of adjacent structure are protected during contact hole etching.

These and other objects of the present invention are achieved in a best mode FET embodiment by the provision of a borderless contact method using a disposable etch stopping spacer to protect the upper edges of adjacent structure during contact hole etching. A gate stack or structure is formed on a substrate adjacent to a source or drain diffusion region. A layer of dielectric material is deposited over the structure including the gate stack to provide electrical isolation between the gate and the borderless contact to be formed subsequently. An etch stopping spacer of a material selectively etchable relative to the aforesaid dielectric material is placed upon the dielectric material so as to protect the sidewalls and the upper edges of the covered gate stack.

The resulting structure is blanketed with a planarized glass layer which is selectively masked and anisotropically etched to provide a hole in the glass for making a borderless contact to the substrate adjacent the gate stack. The hole overlaps the edge of the gate stack. The spacer especially protects the upper edges of the dielectric material covering the gate stack during the anisotropic etching process which selectively etches the glass relative to the spacer and the aforesaid dielectric material. The spacer itself then can be separately etched away, so as to enlarge the contact hole area. Finally, the dielectric material at the bottom of the contact hole is removed and a borderless contact is formed in the hole.

BEST MODE FOR CARRYING OUT THE INVENTION

The borderless contact method of present invention is applied to the exemplary case of a field effect transistor in the figures. As is well understood, borderless contacts must be made to the source and drain areas of the FET without compromising the electrical isolation between the source or drain region and the adjacent gate region. The partial overlap of the borderless source or drain contact relative to the gate region exacerbates the problem of maintaining isolation.

Figure 1:
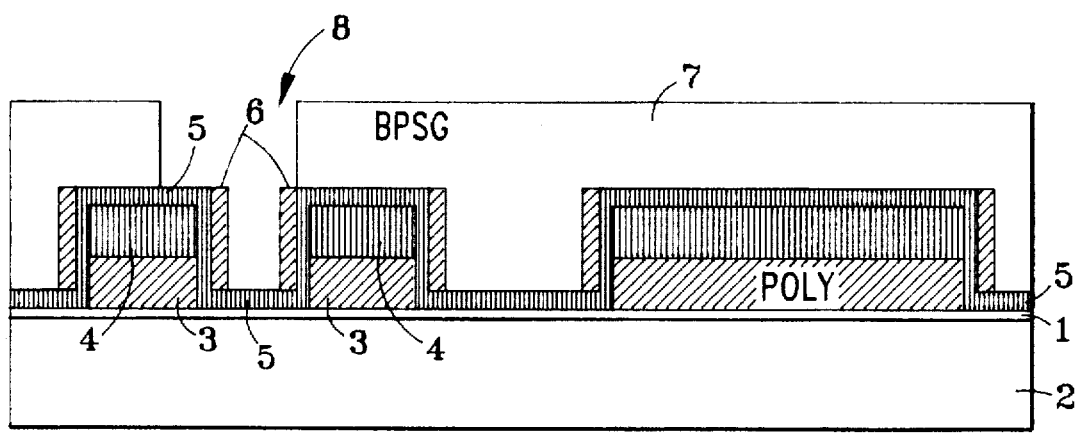
FIGS. 1, 2 and 3 are simplified cross-sectional views of the borderless contact structure as it appears at successive time during the practice of the method of the present invention.

The required isolation is preserved by the use of a disposable etch-stopping spacer in the manner now to be described. Referring to FIG. 1, the FET structure relevant to an understanding of the present invention comprises gate oxide layer 1 on substrate 2, gate polysilicon layer 3 and silicon nitride passivation layer 4. A second silicon nitride layer 5 is deposited over the entire structure to provide isolation between the gate and the borderless contact to be made later.

A polysilicon etch-stopping spacer 6 is formed by blanket depositing about 40 nm polysilicon and then etching it by reactive ion etching. The RIE essentially removes the spacer layer from all horizontal surfaces, allowing it to remain on the vertical surfaces as shown. Then preferably borophosphosilicate glass (BPSG) 7 is formed and planarized over the entire structure so that about 200 nm is provided over the gates. A hole 8 for a borderless contact is etched in the BPSG to complete the structure as shown in FIG. 1. A CHF$_3$/Ar RIE process is suitable.

It should be noted that the aforementioned RIE process produces enhanced sputtering at the upper circumference of the gate structure. However, such sputtering will be mainly confined to the polysilicon spacer 6 which preserves the integrity of the gate cap Si$_3$N$_4$ layer 5 and, concomitantly, the isolation between the gate and the borderless contact yet to be made.

Figure 2:
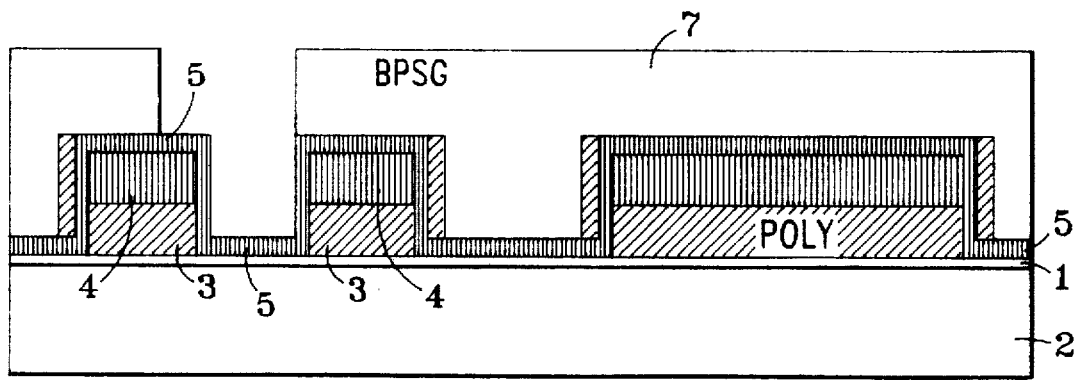
Figure 3:
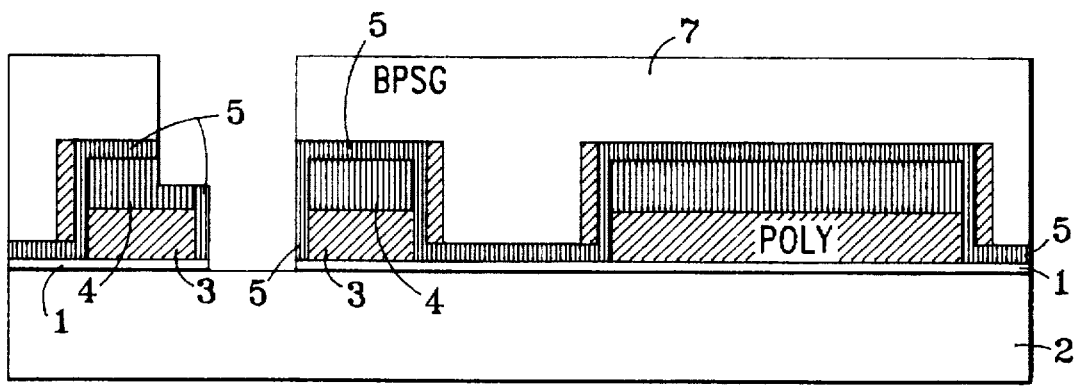

Polysilicon spacer 6, having fulfilled its etch-stopping function, now can be selectively removed in the contact area by a fluorine-based etch to yield the structure shown in FIG. 2. The polysilicon sidewall spacers remaining at sites other than in the contact area are oxidized through the overlying BPSG using HIPOX at 800° C. to eliminate any unwanted conductivity pathways. The removal of the sidewall spacers at the contact site restores the contact to a maximum area value. Finally, the bottom Si$_3$N$_4$ and the underlying oxide 1 area are anisotropically dry etched away, as shown in FIG. 3, so that a borderless contact (not shown) may be formed at the site.

It should be noted that suitable spacer materials in addition to the disclosed polysilicon include BN, undoped SiO$_2$ and, more generally, materials that (a) are insulators, (b) have a low etch rate during the borderless contact hole etch and (c) can be removed with high selectively to Si$_3$N$_4$. In the case of using an insulator material for the spacers, the spacers need not be removed from the non-contact areas and can be left in the structure at such locations.

We claim:

1. A method for making a borderless contact to a first surface of a semiconductor device in which the upper edges of structure adjacent to the site of said contact area are protected during contact hole etching, said method comprising forming semiconductor device structure adjacent said site, covering said structure including said site with a first layer of insulating material, covering said first layer of insulating material with a second layer of material, anisotropically etching said second layer of material so as to remove said second layer of material from all parallel surfaces of said first layer of insulating material and leaving said second layer of material on all perpendicular surfaces of said first layer of insulating material, parallel and perpendicular being relative to said first surface of said semiconductor device, placing a third layer of material on the resulting structure including said perpendicular portions of said second layer of material, said third layer of material being selectively etchable relative to said second layer of material, masking said third layer of material to expose said site, anisotropically etching said third layer of material at said exposed site down to said first layer of insulating material covering said structure including said site using said second layer of material as an etch stop, removing said first layer of insulating material and any underlying layer at said site to expose said first surface.

2. The method defined in claim 1 wherein said first layer of insulating material is silicon nitride, said second layer of material is polysilicon, and said third layer of material is borophosphosilicate glass.

3. The method defined in claim 1 wherein said structure adjacent to said site is the gate of an FET comprising an uppermost layer of silicon nitride.

4. The method defined in claim 1 wherein said second layer of material is selected from the material group comprising polysilicon, boron nitride, and undoped silicon dioxide.

5. The method defined in claim 2 and further including oxidizing said second layer of material remaining on vertical surfaces other than at said site prior to removing said first layer of insulating material.

6. The method defined in claim 1 wherein the materials comprising said first layer of insulating material and said second layer of material are selectively etchable relative to each other.

7. The method defined in claim 1 wherein the materials comprising said first, layer of insulating material, said second and third layers of material are selectively etchable relative to each other.

8. The method defined in claim 1 and further including removing said second layer of material at said site prior to removing said first layer of insulating material at said site.

* * * * *